(12) United States Patent
Fukuda

(10) Patent No.: US 7,146,546 B2
(45) Date of Patent: *Dec. 5, 2006

(54) SEMICONDUCTOR DEVICE

(75) Inventor: Ryo Fukuda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 506 days.

This patent is subject to a terminal disclaimer.

(21) Appl. No.: 10/683,357

(22) Filed: Oct. 14, 2003

(65) Prior Publication Data

US 2004/0078739 A1    Apr. 22, 2004

Related U.S. Application Data

(63) Continuation of application No. 09/708,064, filed on Nov. 8, 2000, now Pat. No. 6,647,520.

(30) Foreign Application Priority Data

Nov. 9, 1999    (JP) .............................. 1999-317887

(51) Int. Cl.
G11C 29/00    (2006.01)

(52) U.S. Cl. ....................... 714/718; 714/742

(58) Field of Classification Search ................ 365/156, 365/230.04, 233, 200; 711/211; 714/718, 714/742

See application file for complete search history.

(56) References Cited

U.S. PATENT DOCUMENTS

| 5,105,388 | A |   | 4/1992 | Itano et al. |
|---|---|---|---|---|
| 5,241,510 | A |   | 8/1993 | Kobayashi et al. |
| 5,422,840 | A | * | 6/1995 | Naiki .......................... 365/156 |
| 5,446,699 | A | * | 8/1995 | Naiki ..................... 365/230.04 |
| 5,559,748 | A |   | 9/1996 | Numata et al. |
| 6,006,313 | A | * | 12/1999 | Fukumoto .................... 711/211 |
| 6,134,181 | A | * | 10/2000 | Landry ........................ 365/233 |
| 6,477,072 | B1 |   | 11/2002 | Shimizu et al. |
| 6,496,947 | B1 |   | 12/2002 | Schwarz |
| 6,728,149 | B1 | * | 4/2004 | Akamatsu .................... 365/200 |

OTHER PUBLICATIONS

Yabe et al., "A Configurable DRAM Macro Design for 2112 Derivative Organizations to be Synthesized Using a Memory Generator," IEEE Journal of Solid-State Circuits (Nov. 1998), 33:1752-57.

* cited by examiner

*Primary Examiner*—David Ton
(74) *Attorney, Agent, or Firm*—Finnegan, Henderson, Farabow, Garrett & Dunner, L.L.P.

(57) ABSTRACT

A semiconductor device has a least one logic circuit and at least one memory macro cell having a plurality of memory cell array blocks each composed of a plurality of memory cells. Addresses for designating the memory cell array blocks in test are selected among external addresses by a switching signal. The semiconductor device may have a plurality of memory macro calls having a plurality of memory cell array blocks each composed of a plurality of memory cells. The memory macro cells are switched in configuration as having the same length of rows or columns between the memory macro cells in test. The configuration is different from a configuration of row and column for a regular operation.

19 Claims, 11 Drawing Sheets

SEMICONDUCTOR DEVICE

This is a continuation of application Ser. No. 09/708,064, filed Nov. 8, 2000, now U.S. Pat. No. 6,647,520 which is incorporated herein by reference, to which Applicant claims the benefit under 35 U.S.C. § 120.

CROSS REFERENCE TO RELATED APPLICATIONS

The subject application is related to subject matter disclosed in Japanese Patent Application No. H 11-317887 filed on Nov. 9, 1999 in Japan to which the subject application claims priority under Paris Convention and which is incorporated herein by reference.

BACKGROUND OF THE INVENTION

The present invention relates to a semiconductor device having memory circuits.

Memory-logic LSIs (system LSIs) have been popular recently. These LSIs are used to constitute a specific system by mounting memory circuits and logic circuits on one chip. Circuits that are usually mounted on separate chips are mounted on one chip for memory-logic LSIs, thus requiring higher performance, lower power consumption and miniaturization (reduction of components).

There are two types for memory-logic LSIs. One is a custom LSI having custom logic and memory circuits. The other type is a ASIC (Application Specific IC) that is a semi-custom LSI having memory circuits (memory macro cells) designed as function blocks.

ASICs are very popular for their flexibility to a variety of users' demands because they can be rearranged in a short turn around time.

As memory macro cells for ASICs, re-configurable memory macro cells have been developed.

Re-configurable memory macro cells are, however, disadvantageous in high cost for testing each macro cell due to different test programs for a plurality of different types of products using memory macro cells configured differently.

Moreover, memory macro cells cannot be tested at the same time due to different address spaces for a plurality of memory macro cells mounted on a one-chip memory-logic LSI.

SUMMARY OF THE INVENTION

A purpose f the present invention is to provide a LSI having re-configurable memory circuits with a low cost for memory testing and also switching in performance specifications.

The present invention provides a semiconductor device including: at least one logic circuit; and at least one memory macro call having a plurality of memory cell array blocks each composed of a plurality of memory cells, wherein addresses for designating the memory cell array blocks in test are selected among external addresses by a switching signal.

Moreover, the present invention provides a semiconductor device including: at least one logic circuit; and a plurality of memory macro calls having a plurality of memory cell array blocks each composed of a plurality of memory cells wherein at least one of the memory macro cells is switched in configuration as having the same length of rows or columns between the memory cell array blocks in test the configuration being different from a configuration of row and column for a regular operation.

Furthermore, the present invention provides a semiconductor device having a plurality of memory macro cells, each memory macro cell including: a plurality of memory cell array blocks each having a plurality of memory cells, composed of rows and columns; a decoder configured to decode a row or a column address signal to select at least one memory cell located on a row or a column corresponding to the decoded address signal; and a switching circuit configured to convert the row or the column address signal in response to a switching signal and supply the converted signal to the decoder to set address spaces having the same number of rows or columns between the plurality of memory cells.

Moreover, the present invention provides a method of testing a semiconductor device having at: least one logic circuit and at least one memory macro cell having a plurality of memory cell array blocks each composed of a plurality of memory cells, including the step of selecting addresses for designating the memory cell array blocks among external addresses by a switching signal.

Furthermore, the present invention provides a method of testing a semiconductor device having at least one logic circuit and a plurality of memory macro cells having a plurality of memory cell array blocks each composed of a plurality of memory cells, including the step of switching at least one of the memory macro cells in configuration as having the same length of rows or columns between the memory macro cells, the configuration being different from a configuration of row and column for a regular operation.

DETAILED DESCRIPTION OF PREFERRED EMBODIMENTS

Preferred embodiments according to the present invention will be disclosed with reference to the attached drawings.

{Embodiment 1}

Figure 1A:
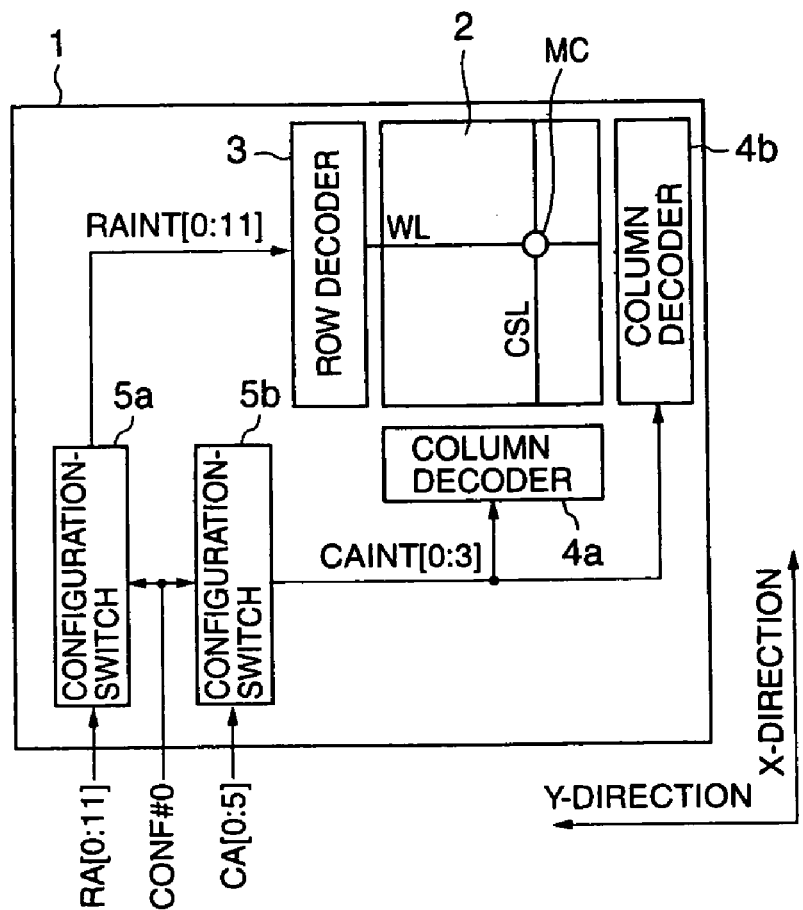
FIG. 1A shows one configuration of a memory macro cell used for a memory-logic LSI on which memory and logic circuits are mounted as a preferred embodiment according to the present invention.
Figure 1B:
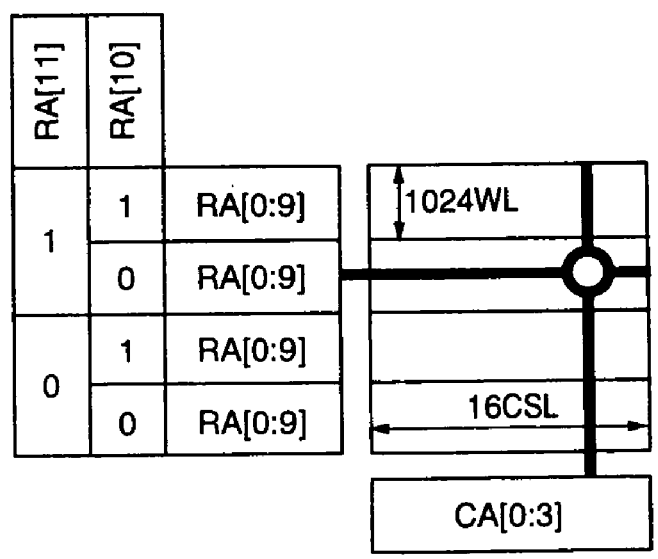
FIG. 1B illustrates address allocation to the memory macro cell configured an shown in FIGS. 1A.
Figure 2A:
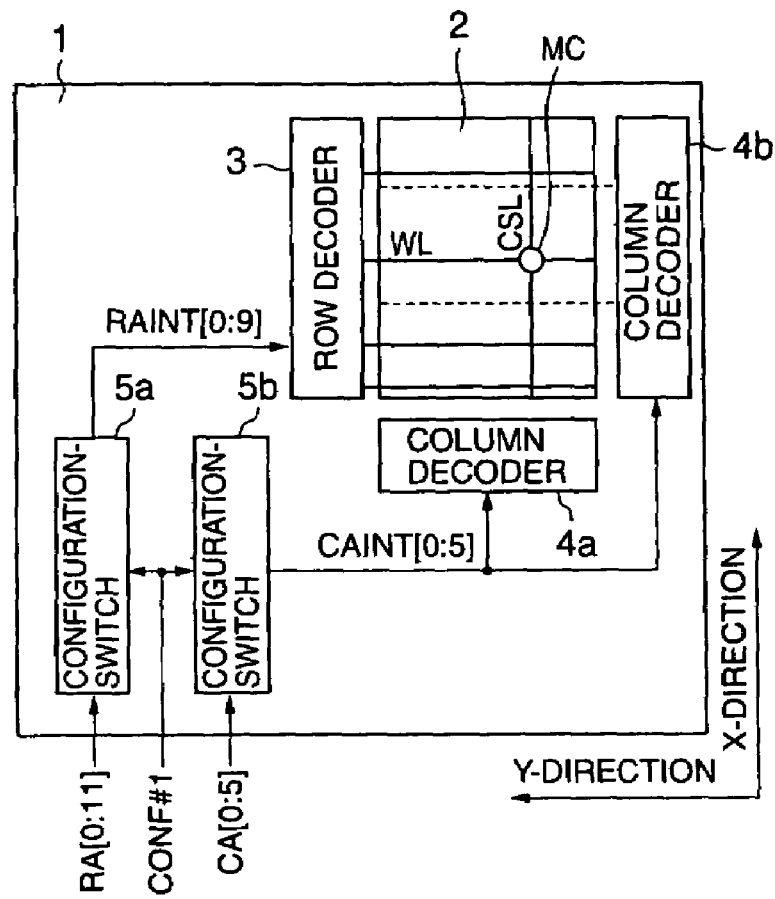
FIG. 2A shows another configuration of the memory macro cell shown in FIG. 1.
Figure 2B:
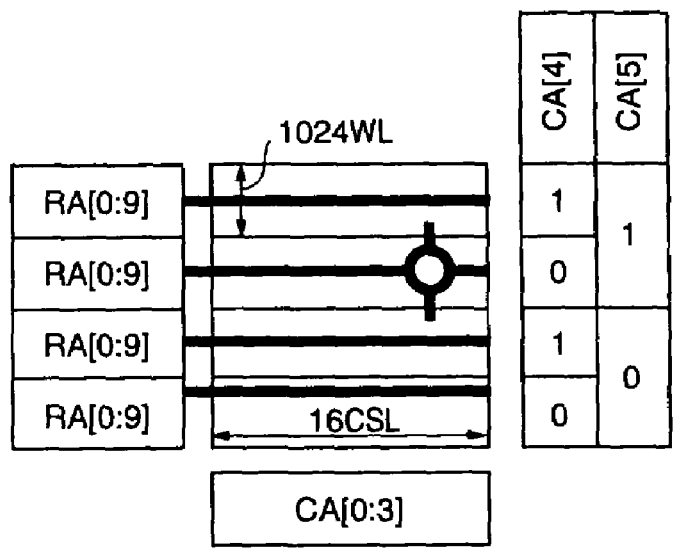
FIG. 2B illustrates address allocation to the memory macro cell configured as shown in FIGS. 2A.

FIG. 1A shows one configuration of a memory macro cell 1 used for a memory-logic LSI on which memory and logic circuits are mounted. FIG. 2A shows another configuration of the memory macro cell 1. FIGS. 1B and 2B illustrate address allocation to the memory macro cell 1 configured as shown in FIGS. 1A and 2A, respectively.

An input configuration indication signal CONF is at a level "0" in FIG. 1A whereas it is "1" in FIG. 2A.

The memory macro cell 1 has a 64 k-bit storage capacity in this embodiment. The 64 k bits are configured as 4 k bits in row and 16 bits in column in FIG. 1A whereas 1 k bits in row and 64 bits in column in FIG. 2A. These configurations are switched by the signal CONF according to its level "0" or "1".

The memory macro cell 1 in this embodiment is a DRAM having a memory cell array 2 in which each memory cell MC is provided at the intersection of a word line WL and a column selection line CSL a row decoder 3 for word line selection, and a column decoders 4a and 4b for selection of the column selection line.

Data can be written to and read from memory cells MC according to externally input row addresses RA [0:11] and column addresses [0:5].

The row addresses RA [0:11] and column addresses CA, [0:5] are input to configuration-switching circuits 5a and 5b, respectively. These circuits decide whether or not to use all of the row addresses RA [0:11] and column addresses CA [0:5].

In FIG. 1A, a "0"-CONF signal is supplied to the configuration-switching circuit 5a to validate all the row address s RA [0:11]. The row addresses RA [0:11] are converted into internal row address a RAINT [0:11] and supplied to the row decoder 3. The row decoder 3 activates word lin s WL corresponding to the internal row addresses RAINT [0:11]. In other words, a word line/4 k bits is activated for each of the 12-bit internal row addresses RAINT [0:11].

The "0"-CONF signal is also supplied to the configuration-switching circuit 5b to invalidate the upper 2 bits of the column addresses CA [0:5]. The column addresses CA [0:5] are thus converted into internal column addresses CAINT [0:3] and supplied to the column decoder 4a. The column decoder 4a activates column selection lines CSL corresponding to the internal column addresses CAINT [0:3].

The other column decoder 4b is used for internal addresses CA [4:5] that are required when some of the rows in the direction X are not allocated row addresses. In FIGS. 1A and 1B, however, the column decoder 4b is not used due to invalidation of the internal addresses CA [4:5] in this embodiment.

In FIG. 2A, a "1"-CONF signal is supplied to the configuration-switching circuit 5a to invalidate the upper two bits of the row addresses RA [0:11]. The row addresses RA [0:11] are thus converted into internal row addresses RAINT [0:9] and supplied to the row decoder 3. The row decoder 3 activates word lines WL corresponding to the internal row addresses RAINT [0:9]. In other words, a word line/1 k bits is activated for each of the 10-bit internal row addresses RAINT [0:9].

The "1"-CONF signal is also supplied to the configuration-switching circuit 5b to validate all the column addresses CA [0:5]. The column addresses CA [0:5] are converted into internal column addresses CAINT [0:5]. The lower 4 bits of the internal column addresses CAINT [0:5] are supplied to the column decoder 4a whereas the upper 2 bits are supplied to the column decoder 4b. The column decoder 4a activates column selection lines CSL corresponding to internal column addresses CAINT [0:3]. The column decoder 4b activates column selection lines CSL corresponding to internal column addresses CAINT [4:5].

As disclosed, in response to the "0"-CONF signal, the memory macro cell 1 is addressed with the row addresses RA [0:11] and the column addresses CA [0:3] to configure a 4 k-row×16-column memory cell, as shown in FIGS. 1A and 1B.

On the other hand, in response to the "1"-CONF signal, the memory macro cell 1 is addressed with the row addresses RA [0:9] and the column addresses CA [0:5] to configure a 1 k-row×64-column memory cell, as shown in FIGS. 2A and 2B.

As disclosed above, the memory macro cell according to the present invention is equipped with configuration-switching circuits for changing the configuration of the memory cell array in response to a configuration indication signal CONF.

Therefore, the present invention achieves the same test for a plurality of memory macro cells by changing the configuration of their memory cell arrays into the same configuration even though the cells will be used for different LSI types.

Changing the configuration of the memory cell arrays of the memory macro cells according to the present invention into a 1 k-row configuration is one of the preferable ways for conducting the same test to the memory macro cells installed in different types of LSI. For example, the memory macro cell shown in FIGS. 1A and 1B installed in a one type of LSI can be changed to that shown in FIGS. 2A and 2B to a test conducted for a plurality of memory macro calls.

Figure 3:
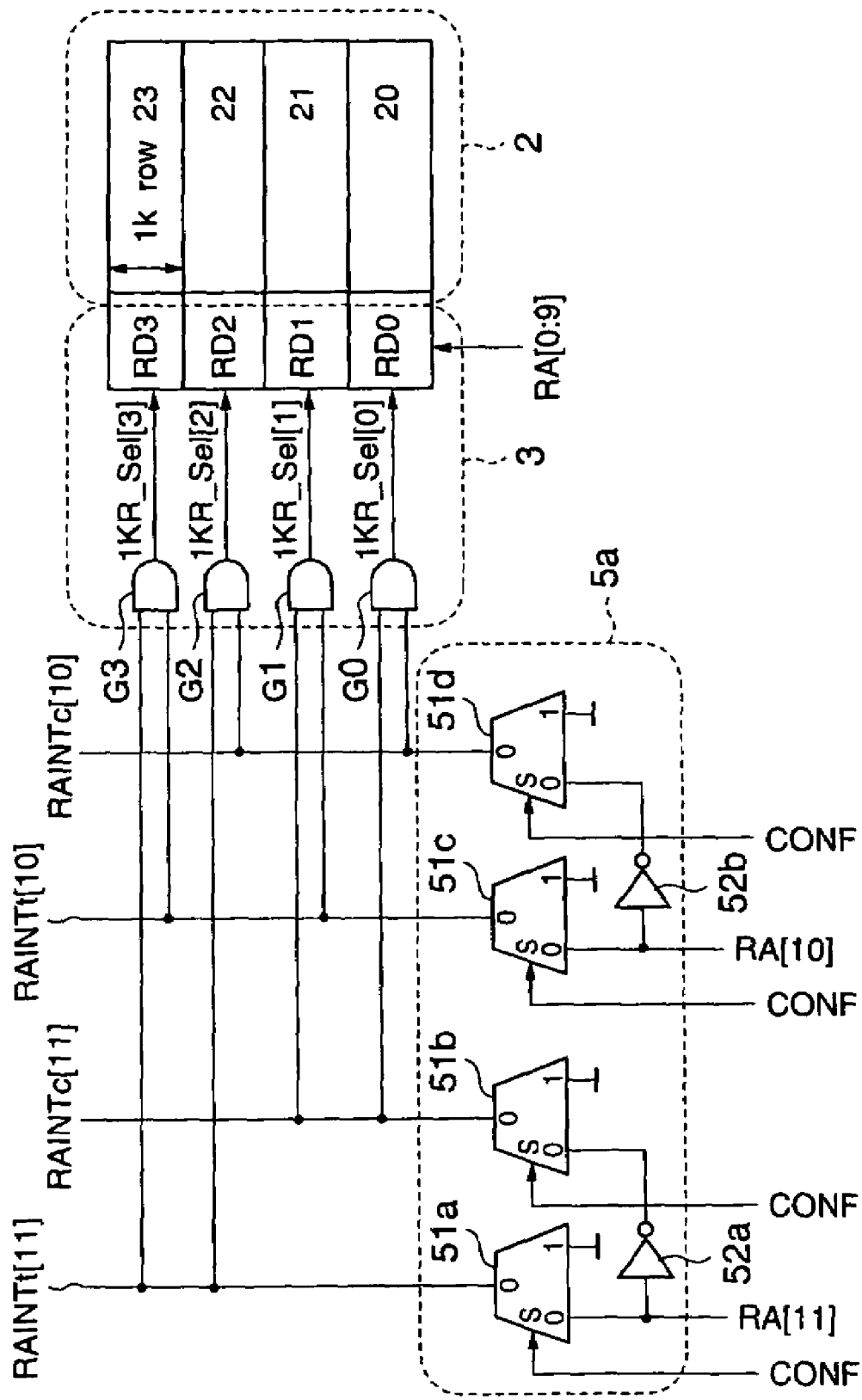
FIG. 3 shows a block diagram of a row-side configuration-switching circuit and a row decoder shown in FIGS. 1A and 2A.

FIG. 3 shows a block diagram of the configuration-switching circuit 5a and the row decoder 3 shown in FIGS. 1A and 2A.

The configuration-switching circuit 5a shown in FIG. 3 is a row address-switching circuit equipped with four multiplexers 51a to 51d and two inverters 52a and 52b.

The configuration-switching circuit 5a makes valid or invalid the upper two-bit row addresses [10:11] to obtain complementary internal row addresses RAINTt [10:11] and RAINTc [10:11].

The multiplexers 51a to 51d have a switch terminal "S", a first input terminal "0" and a second input ten al "1" and an output terminal "O". Either of the first or the second terminal is connected to the output terminal in response to a configuration indication signal CONF supplied to the switch terminal.

In detail, row addresses RA [11] and RA [10] are supplied to the first input terminals "0" of the multiplexers 51a and 51c, respectively.

The row address RA [11] is further inverted by the inverter 52a and supplied to the first input terminal "0" of the multiplexer 51b. The row address RA [10] is further inverted by the inverter 52b and supplied to the first input terminal "0" of the multiplexer 51d.

A supply voltage Vcc is fed to the second input terminal. "1" of the multiplexers 51a to 51d.

The row decoder 3 is equipped with AND gates G0 to G3 for 1 k-row Selection and decoders RD0 to RD3 for cell selection in a 1 k row.

All the combinations of the internal row addresses RAINTt [10:11] and RAINTc [10:11] are supplied to the AND gates G0 to G3 to generate a 1 k-row selection signal 1KR_SEL [0]. 1KR_SEL [1]. 1KR_SEL [2] or 1KR_SEL [3].

The lower row addresses RA [0:9] are directly supplied to the decoders RD0 to RD3 without passing through the configuration-switching circuit 5a. One of the 1 k-row selection signals 1KR_SEL [0] to 1KR_SEL [3] supplied to the corresponding decoder RD0, RD1, RD2 or RD3 activates a word line in the corresponding 1 k-row block 20, 21, 22 or 23 in response to one of the row addresses RA [0:9].

A "0"-CONF signal supplied to the input terminal "S" of the multiplexer 51a lowers the level of the terminal "S" to low to bring the row address RA [11] into the internal row address RAINTt [11].

On the other hand, the "0"-CONF signal supplied to the input terminal "S" of the multiplexer 51b via the inverter 52a raises the level of the terminal "S" to high to bring the row address RA [11] into the inverted internal row address RAINTc [11].

Likewise, the 0"-CONF signal is supplied to the multiplexers 51c and 51d obtain complementary internal row addresses [10] and RAINTc [10] corresponding to the row address RA [10].

For example, row addresses [10] and [11] at high and low levels, respectively, provides a high-level internal row address RAINTt [10], a low-level internal row address RAINTc [10], a low-level internal row address RAINTt [11] and a high-level internal row address RAINTc [11].

The combination of these addresses brings the output of the AND gate G1 into high whereas low for the outputs of the AND gates G0, G2 and G3. This produces a high-level 1KR SEL [1] selection signal only to activate a word line in the block 21 among the 1 k-row blocks 20 to 23.

As disclosed above, the "0"-CONF signal activates 1 k-row block corresponding to one of the external row addresses RA [10:11] to change the memory macro cell 1 into a 4 k-row memory cell, as shown in FIGS. 1A and 1B.

On the other hand, a "1"-CONF signal forces all the multiplexers 51a to 51d to output the supply voltage Vcc to invalidate the row addresses RA [10:11]. This brings all the internal row addresses RAINTt [10:11] and RAINTc [10:11] into high for the AND gates G0 to G3, thus generating high-level signals 1KR_SEL [0] to [3]. The high-level signals activate the word lines of the all the 1 k-row blocks 20 to 23 to change the memory macro cell 1 into a 1 k-row memory cell, as shown in FIGS. 2A and 2B.

Figure 4:
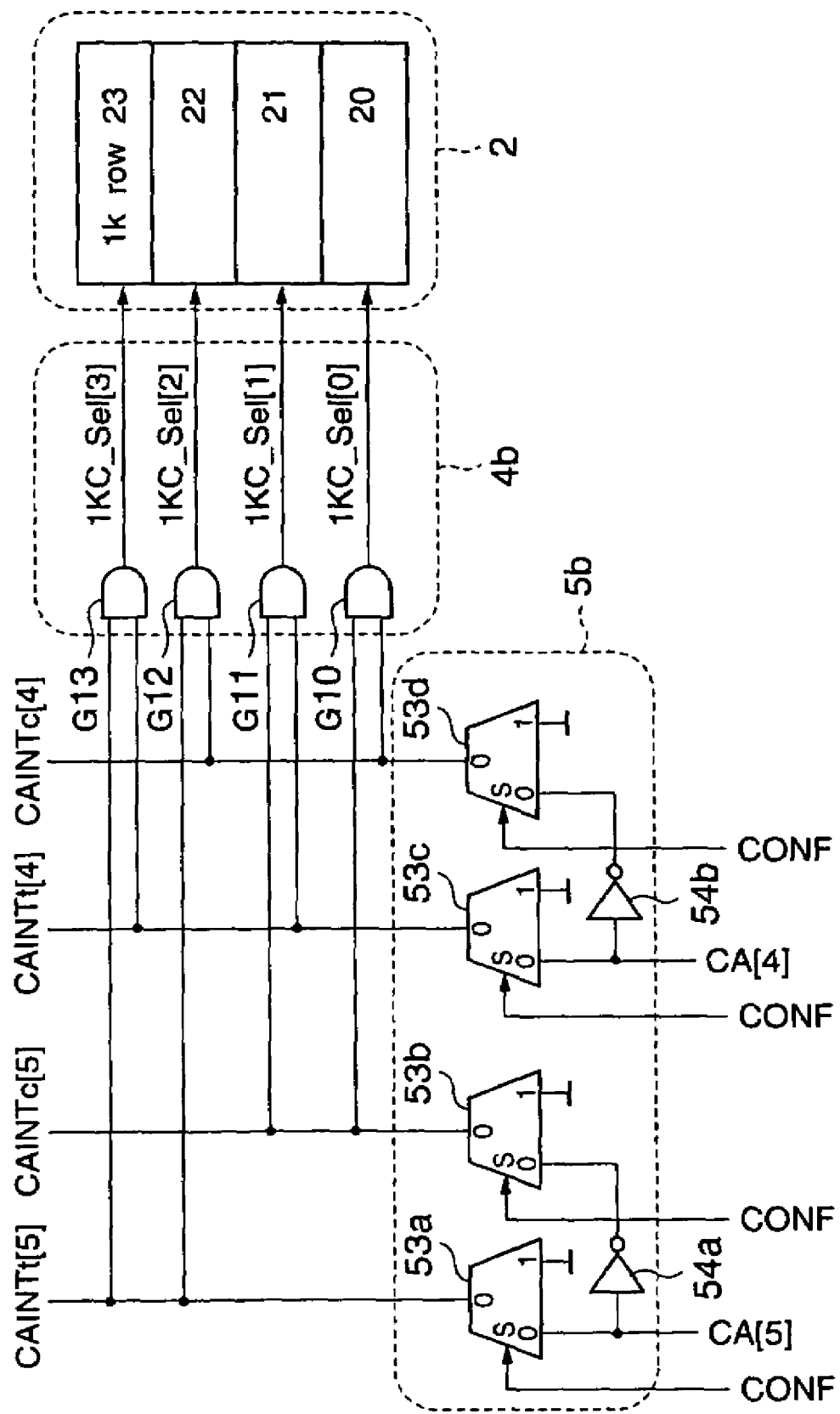
FIG. 4 shows a block diagram of a column-side configuration-switching circuit 5b and a column decoder shown in FIGS. 1A and 2A.

FIG. 4 shows a block diagram of the configuration-switching circuit 5b and the column decoder 4b shown in FIGS. 1A and 2A.

The configuration-switching circuit 5b shown in FIG. 4 is a column address-switching circuit equipped with four multiplexers 53a to 53d and two inverters 54a and 54b.

The configuration-switching circuit 5b makes valid or invalid the upper two-bit column addresses CA [4:5] to obtain complementary internal column addresses CAINTt [4:5] and CAINTc [4:5].

The multiplexers 53a to 53d have a switch terminal "S", a first input terminal "0" and a second input terminal "1" and an output terminal "O". Either of the first or the second terminal is connected to the output terminal in response to a configuration indication signal CONF supplied to the switch terminal.

In detail, column addresses CA [5] and CA [4] are supplied to the first input terminals "0" of the multiplexers 53a and 53c, respectively.

The column address RA [5] is further inverted by the inverter 54a and supplied to the first input terminal "0" of the multiplexer 53b. The column address CA [4] is further inverted by the inverter 54b and supplied to the first input terminal "0" of the multiplexer 53d.

A supply voltage Vcc is fed to the second input terminals "1" of the multiplexers 53a to 53d.

The column decoder 4b is equipped with AND gates G10 to G13 for 1 k-row selection.

All the combinations of the internal column addresses CAINTt [4:5] and CAINTc [4:5] are supplied to the AND gates G10 to G13 to generate a 1 k-row selection signal 1KC_SEL [0]. 1KC_SEL [1], 1KC_SEL [2] or 1KC_SEL [3].

The lower column addresses CA[0:3] are directly supplied to the other column decoder 4a without passing through the configuration-switching circuit 5b. One of the 1 k-row selection signals 1KC_SEL [0] to 1KC_SEL [3] activates a word line in the corresponding 1 k-row block 20, 21, 22 or 23 in response to one of the column addresses CA [0:3].

A "1"-CONF signal supplied to the input terminal "S" of the multiplexer 53a raises the level of the terminal "S" to high to bring the column address CA [5] into the internal column address CAINTt [5].

On the other hand, the "1"-CONF signal supplied to the input terminal "S" of the multiplexer 53b via the inverter 54a lowers the level of the terminal "S" to low to bring the column address CA [5] into the inverted internal column address CAINTc [5].

Likewise, the "1"-CONF signal is supplied to the multiplexers 53c and 53d obtain complementary internal column addresses CAINTt [4] and CAINTc [4] corresponding to the column address RA [4].

For example, column addresses CA [4] and [5] at high and low levels, respectively, provides a high-level internal column address CAINTt [4], a low-level internal column address CAINTc [4], a low-level internal column address CAINTt [5] and a high-level internal column address CAINTc [5].

The combination of these addresses brings the output of the AND gate G11 into high whereas low for the outputs of the AND gates G11, G12 and G13. This produces a high-level 1KC_SEL [1] selection signal only to activate a column line CSL in the block 21 among the 1 k-row blocks 20 to 23.

As disclosed above, the "1"-CONF signal activates 1 k-row block corresponding to one of the external column addresses RA [4:5] to change the memory macro cell 1 into a 64-column memory cell, as shown in FIGS. 2A and 2B.

On the other hand, a "0"-CONF signal forces all the multiplexers 53a to 53d to output the supply voltage Vcc to invalidate the column addresses CA [4:5]. This brings all the internal column addresses CAINTt [4:5] and CAINTc [4:5] into high for the AND gates G10 to G13, thus generating high-level signals 1KC_SEL [0] to [3]. The high-level signals activate the word lines of the all the 1 k-row blocks 20 to 23 to change the memory macro cell 1 into a 16-column memory cell, as shown in FIGS. 1A and 1B.

Figure 5:
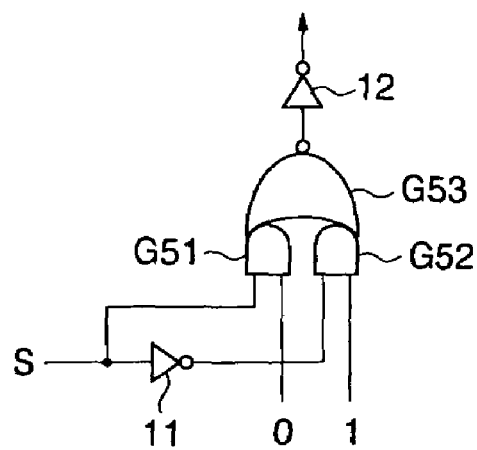
FIG. 5 shows a circuit diagram of multiplexers shown in FIG. 4.

A circuit diagram shown in FIG. 5 is an example of the multiplexers 53a to 53d shown in FIG. 4.

A multiplexer shown in FIG. 5 is equipped with an inverter I1, AND gates G51 and G52, a NOR gate G53 and an inverter I2. The first input terminal "0" and the input terminal "S", and the second input terminal "1", such as, those shown in FIG.4, are connected to the AND gates G51 and G52, respectively. Data input to the terminal "S" is directly supplied to the AND gate G51 and further inverted by the inverter I1 and supplied to the AND gate G52. The output of the two AND gates are supplied to the NOR gate G53 and inverted by the inverter I2.

A high-level signal supplied to the input terminal "S" allows an input signal to the first input terminal "0" to be output from the inverter I2 (output terminal "O"). On the other hand, a low-level signal supplied to the input terminal "S" allows an input signal to the second input terminal "1" to be output from the inverter I2.

Although not shown, for the multipliers 51a to 51d shown in FIG. 3. th first input terminal "0" and the second input terminal "1" connected to the AND gates G51 and G52, respectively, are inverted.

In this case, a low-level signal supplied to the input terminal "S" allows an input signal to the first input terminal "0" to be output from the inverter I2 (output terminal "O"). On the other hand, a high-level signal supplied to the input terminal "S" allows an input signal to the second input terminal "1" to be output from the inverter I2.

As disclosed above, the 64 k-memory macro cell according to the preferred embodiment is changeable between configurations having different row-column ratios in response to a configuration-switching signal CONF.

It is thus achieved that, for ale, a 64 k-memory macro cell is tested as having a (4 k-row×16-column) configuration for installation on a particular system LSI and is changed into a (3 k-row×64-column) configuration for a test which is conducted for every 64 k-memory macro cell with no consideration of LSI types.

Therefore, a plurality of memory macro cells according to the present invention in a 1 k-row configuration allows a test having the same test program common to every memory macro cell.

The present invention is disclosed more in detail with a plurality of memory macro cells.

Figure 6A:
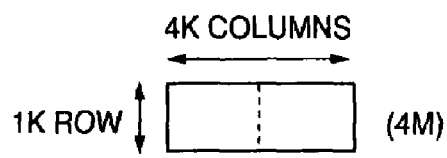
FIGS. 6A to 6C illustrate configurations of memory macro calls installed in different products.
Figure 6B:
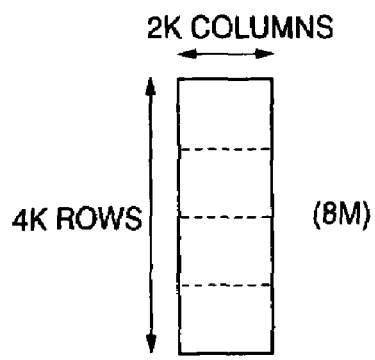
Figure 6C:
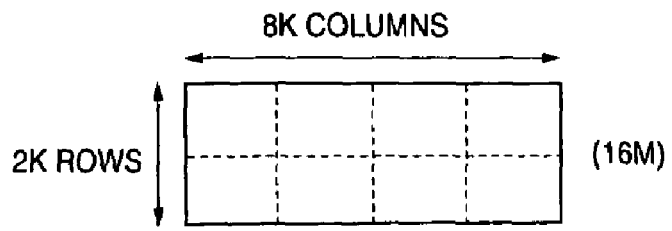

FIGS. 6A to 6C illustrate configurations of memory macro cells according to the present invention installed in different LSI types.

Illustrated in FIGS. 6A, 6B and 6C are a (1 K-row×4 K-column) 4M-memory macro cell, a (4 K-row×2 K-column) 8M-memory macro cell and a (2 K-row×8 K-column) 16 M-memory macro cell, respectively, for respective LSI types.

Each memory cell is tested as it is with no configuration changing for a particular LSI type on which the memory cell will be installed.

Figure 7A:
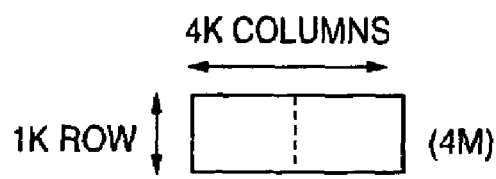
FIGS. 7A to 7C illustrate configurations changed from those shown in FIGS. 6A to 6C.
Figure 7B:
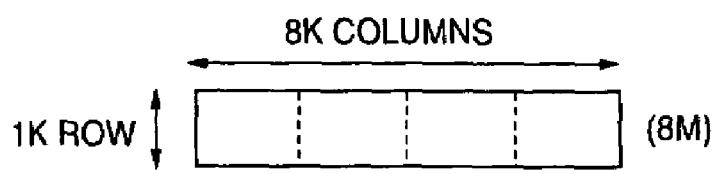
Figure 7C:
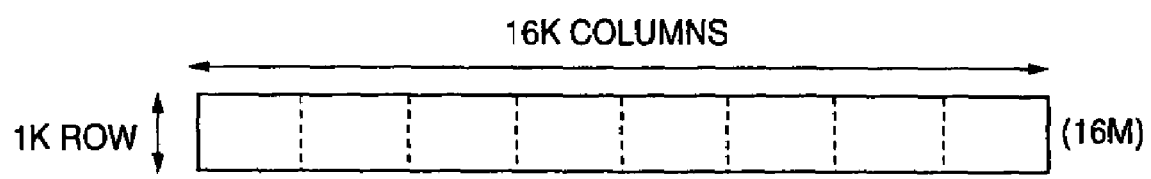

On the contrary, the memory cells are changed into configurations having 1 k-row addresses as illustrated in FIGS. 7A to 7C by means of a configuration-switching signal CONF for a test common to every memory macro cell.

In FIG. 7A, the 4 M-memory macro cell has no change in configuration from that shown in FIG. 6A.

In FIG. 7B, the 8 M-memory macro cell is changed into a (1 K-raw×8 K-column) configuration from the (4 K-row×2 K-column) configuration shown in FIG. 6B.

In FIG. 7C, the 16 M-memory macro cell is changed into a (1 K-row×16 K-column) configuration from the (2 K-row×8 K-column) configuration shown in FIG. 6C.

Figure 8A:
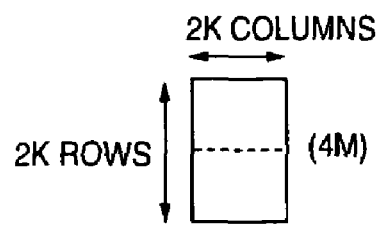
FIGS. 8A to 8C illustrate different configurations changed from those shown in FIGS. 6A to 6C.
Figure 8B:
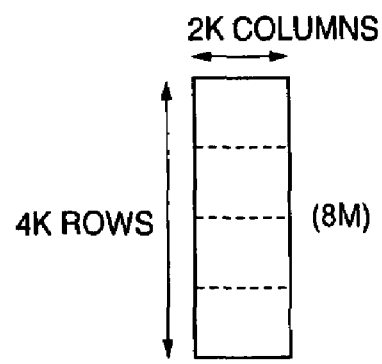
Figure 8C:
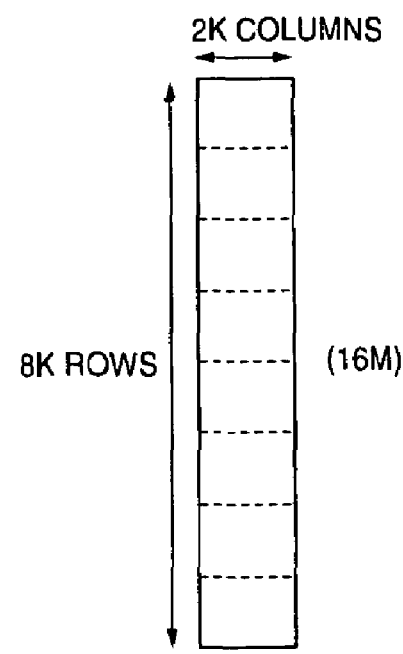

FIGS. 8A to 8C illustrate 2 K-culumn configurations changed from 4 K-, 2 K- and 8 K-column configurations shown in FIGS. 6A to 6C, respectively.

The same row capacity-configuration as illustrated in FIGS. 7A to 7C and 8A to 8C allows the sane test program, failed bit map-template, and so on, thus reducing a cost for testing.

{Embodiment 2}

Figure 9:
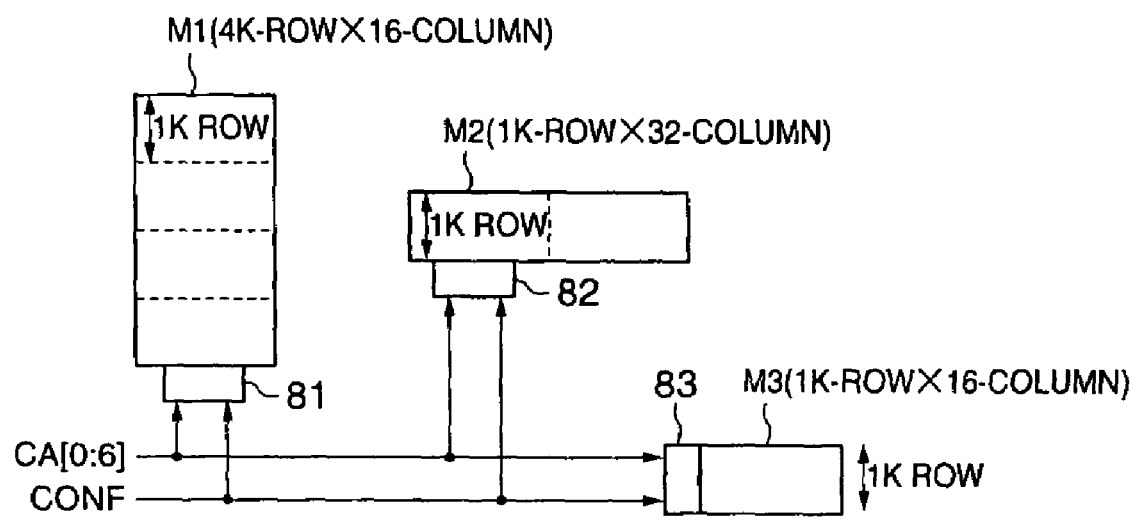
FIG. 9 illustrates three memory macro cells installed on one chip for a particular type of system LSI as another preferred embodiment according to the present invention.

FIG. 9 illustrates three memory macro cells installed on one chip for a particular type of system LSI.

Memory macro cells M1, M2 and M3 are a 64 K-bit (4 K-row×16-column)-, a 32 K-bit (1 K-row×32-column)- and a 16 K-bit (1-row×16-column)-memory macro cell, respectively. One column of the memory macro cell M2 corresponds to two I/Os. The Memory macro cells M1, M2 and M3 have configuration-changing circuits 81 to 83, respectively corresponding to the column configuration-changing circuit 5b shown in FIG. 1.

Figure 10A:
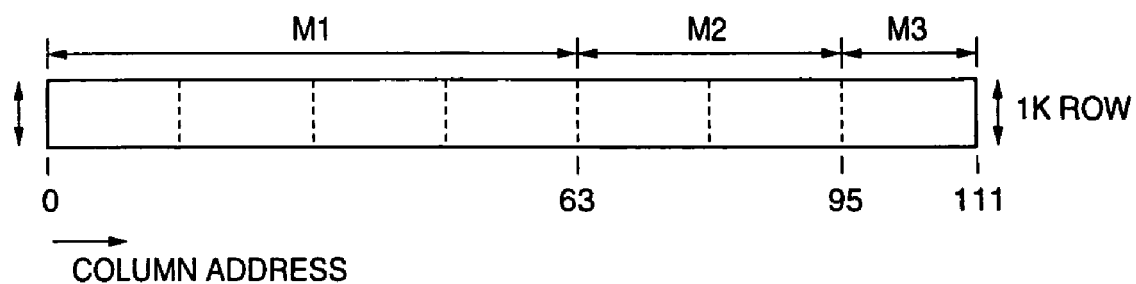
FIGS. 10A and 10B illustrate different configurations changed from those shown in FIGS. 9.
Figure 10B:
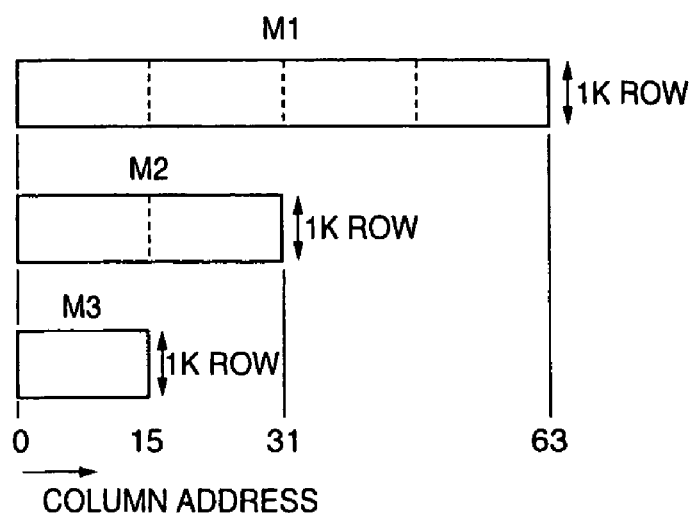

FIG. 10A illustrates address allocation to the memory macro cells M1 to M3 shown in FIG. 9. The memory macro cells are continuously accessible with increase in external addresses as if they constitute one memory macro cell. FIG. 10B illustrates the configurations of the memory macro cells M1, M2 and M3 for regular access. In FIG. 10B, the address allocation to the memory macro cell M1 only has been changed like the Embodiment 1.

The configuration illustrated in FIG. 10A is attained as follows:

The (4 K-rows 16-column) configuration of the memory macro cell M1 is changed into a (1K-row×64-column) configuration by means f a configuration indication signal CONF supplied to the column configurati n-changing circuit 81 (FIG. 9) with column address allocation from 0 to 63.

For the memory macro cell M2, the column addresses CA are shifted by 64 and the column addresses 64 to 95 are allocated for two I/Os per column by the column configuration-changing circuit 82 (FIG. 9).

For the memory macro cell M3, the column address (CA) 64 is shifted by 32 to allocate the column addresses 96 to 111 by the column configuration-changing circuit 83 (FIG. 9).

Figure 11:
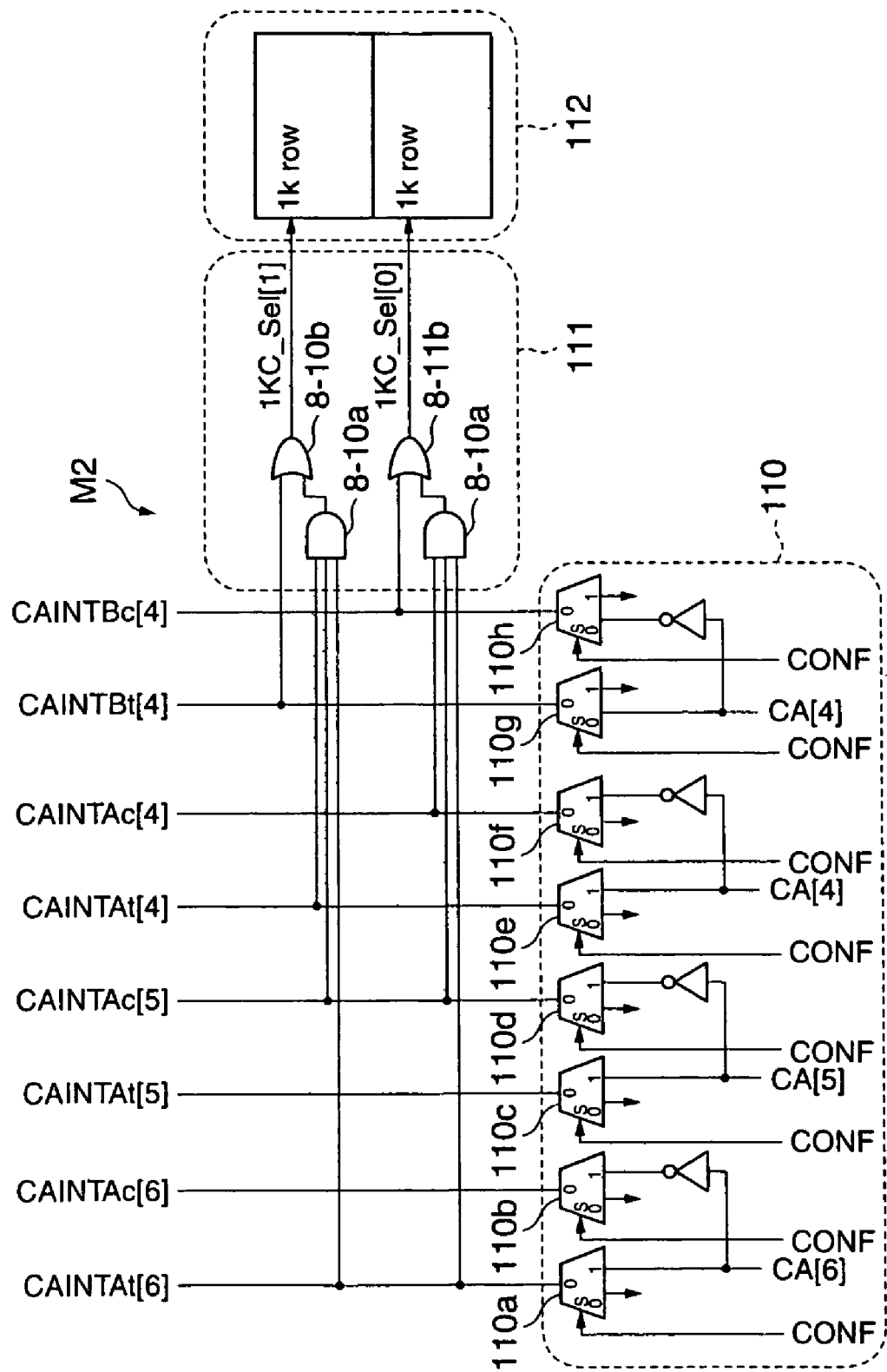
FIG. 11 shows circuit diagrams of a column-side configuration-switching circuit and a column decoder in the embodiment shown in FIG. 9.

FIG. 11 shows a circuit diagram used for column address shifting for, for example, the memory macro cell M2 from FIG. 9 to FIG. 10A.

Shown in FIG. 11 are a memory call array 112 of two 1K rows corresponding to the memory macro cell M2 (FIG. 9), and a column configuration-switching circuit 110 and a column decoder 111 for the memory cell array 112.

The column configuration-switching circuit 110 has multipliers 110a to 110h and their corresponding inverters, controlled by a configuration-switching signal CONF, like those shown in FIGS. 3 and 4.

For a test-configuration A shown in FIG. 10A, the column addresses CA [4:6] are converted into complementary internal column addresses CAINTAt [4:6] and CAINTAc [4:6] and supplied to the column decoder 111.

For a regular-configuration B shown in FIG. 10B, the column address CA [4] is converted into complementary internal column addresses CAINTAt [4] and CAINTAc [4] and supplied to the column decoder 111.

A decode output for the test-configuration A and that for the regular-configuration B are ORed by the column decoder 111. AND gates 8–10a and 8–11a constitute a decoder for the test-configuration A. The outputs of the AND gates 8–10a and 8–11a are fed to OR gates 8–10b and 8–11b, respectively. There is no specific decoder for the regular-configuration B because of one address. Internal column addresses are directly supplied to the OR gates 8–10b and 8–11b.

In detail, the internal column address s CAINTAt [6], CAINTAc [5] and CAINTAt [4] are supplied t the AND gates 8–10a that produces a high-level output when all the input addresses are high.

The output of the AND gates 8–10a and an internal column address CAINTBt [4] are supplied to the OR gate 8–10b that produces a selection signal 1KC_Sel [1] for selecting one of the 1K-row.

On the other hand, internal column addresses CAINTAt [6], CAINTAc [5] and CAINTAc [4] are supplied to the AND gates 8–11a that produces a high-level output when all the input addresses are high.

The output of the AND gates 8–11a and an internal column address CAINTBc [4] are supplied to the OR gate 8–11b that produces a selection signal 1KC_Sel [0] for selecting the other 1K-row.

A "0"-configuration indication signal CONF forces the multiplexers 110g and 110h to connect the first input terminal "1") (Vss) to the output terminal "O". This brings the internal column addresses CAINTBt [4] and CAINTBc [4] into a low level (non-active state), thus no 1K-row being selected in response to these addresses.

On the other hand, the "0"-configuration indication signal CONF allows the multiplexers 110a to 110f to produce high-level internal column addresses CAINTAt [4:6] and low-level internal column addresses CAINTAc [4:6] in response to the column addresses CA [4:6].

In detail, a high-level column address CA [6] and a low-level column address CA [5] activate either one of the selection signals 1KC_Sel [0:1] in accordance with the value of column address CA [4] to activate either one of the two 1K-rows in the memory cell array 112, which means addresses 64 to 95 are allocated to the column address space of the memory macro cell M2, as shown in FIG. 10A.

On the contrary, a "1"-configuration indication signal CONF forces all the internal column addresses CAINTAt [4:6] and CAINTAc [4:6] to be low without respect to input column addresses.

The "1"-configuration indication signal CONF allows the internal column addresses CAINTBt [4] and CAINTBc [4] to be active in accordance with th input column address CA [4]. This activates either one of the selection signals 1KC_Sel [0:1] to activate either one of the two 1K-rows in the memory cell array 112, which means addresses 0 to 31 are allocated to the column address of the memory macro cell M2, as shown in FIG. 10B.

According to this embodiment, column address allocation as disclosed above offers a test with increase in address for successive access to the memory macro cells M1 to 93 as if they constitute one (1 k-row×112-column) memory macro cell. A period of such a test is very short compared to tests in which the memory macro cell M1 to M3 are accessed separately.

FIG. 9 illustrates different types (capacity) of the memory macro cells M1 to M3. The present invention is, however, is applicable to the same type (capacity) of the memory macro cells.

Moreover, FIG. 10A illustrates successive address allocation, such as, from 0 to 63, 64 to 95 and 96 to 111. Not only that, the present invention achieves un-successive address allocation, such as, from 0 to 63, 64 to 84 and 96 to 111.

Figure 12:
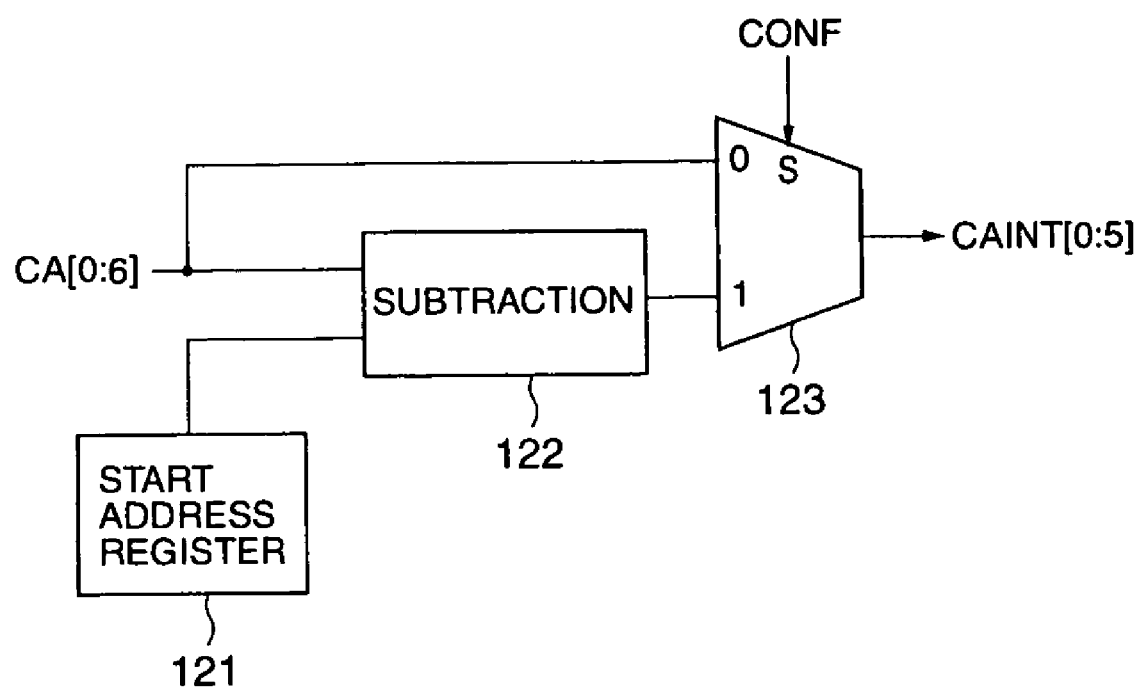
FIG. 12 shows a modification to the configuration-switching circuit shown in FIG. 11.

FIG. 12 shows a modification to the configuration-switching circuit for column-address shifting, such as, illustrated in FIG. 10A, for the macro memory cell M2 shown in FIG. 9.

In FIG. 12, a start address stored in a start address register 121 is supplied to a subtracter 122 and subtracted from input column addresses CA [0:6]. The output of the subtracter 122 and the column addresses CA [0:6] are supplied to a multiplxer 123, either one of them being output as internal addresses [0:6] according to a configuration-switching signal CONF "0" or "1".

A "1"-configuration-switching signal CONF allows the input column addresses CA [0:6] as internal addresses [0:6] to allocate addresses 0 to 31 in a regular address space for the memory macro cell 42 as illustrated in FIG. 10B On the other hand, a "0"-configuration-switching signal CONF allocates the values, such as, 64 to 95, as illustrated in FIG. 1A, shifted from the start address stored in the start address register 121 in a column address space for the memory macro cell M2.

As disclosed, this modification also achieves selection between th test-configuration A and the regular-configuration B.

Disclosed so far is change in configuration of memory macro cell for reduction in cost of test. Not only limited to this, however, the present invention also achieves change in configuration of memory macro cells mounted on a memory-logic LSI for specific access speed and power consumption, for example, change between the (1 k-row×4 k-column)-configuration shown in FIG. 6A and the (2 k-row×2 k-column)-configuration shown in FIG. 8A according to a configuration-switching signal CONF.

In detail, for example, the memory macro cell is changed to the (1 k-row×4 k-column)-configuration according to a "0"-configuration-switching signal CONF. It is then changed to the (2 k-row×2 k-column)-configuration according to a "1"-configuration-switching signal CONF.

The former configuration has a high access speed because of many columns, however, consumes much power. Contrary to this, the latter configuration, has a low access speed, however, consumes little power.

As disclosed, the present invention offers a variety of usage of memory-logic LSIs by changing or selecting configuration of memory macro cells as one of performance specifications.

As disclosed above, the present invention offers memory macro cells that are changeable in configuration. Reduction in cost of test is thus achieved by changing memory macro cells to be used for different purposes or different types of products into the same configuration.

Moreover, according to the present invention, a plurality of memory macro cells mounted on a one-chip LSI are changed into different configurations, thus achieving the same test to the cells by allocating a series of address space to them.

What is claimed is:

1. A semiconductor device comprising:
   at least one logic circuit; and
   at least one memory macro cell having a plurality of memory cell array blocks each composed of a plurality of memory cells,
   wherein addresses for designating the memory cell array blocks in test are selected among external addresses by a switching signal and the memory macro cell is switched in configuration as having the same length of rows corresponding to one memory cell array block in the test.

2. A semiconductor device comprising:
   at least one logic circuit; and
   at least one memory macro cell having a plurality of memory cell array blocks each having a plurality of memory cells, composed of rows and columns, a decoder configured to decode a row or a column address signal to select at least one memory cell located on a row or a column corresponding to the decoded address signal, and a switching circuit configured to convert the row or the column address signal in response to a switching signal and supply the converted signal to the decoder to set address spaces having the same length of rows or columns between the plurality of memory cells, wherein addresses for designating the memory cell array blocks in test are selected among external addresses by a switching signal.

3. A semiconductor device comprising:

at least one logic circuit; and a plurality of memory macro cells having a plurality of memory cell array blocks each composed of a plurality of memory cells, wherein at least one of the memory macro cells is switched in configuration as having the same length of rows or columns between the memory cell array blocks in test, the configuration being different from a configuration of row and column for a regular operation.

4. The semiconductor device according to claim 3, wherein each memory macro cell is a DRAM.

5. The semiconductor device according to claim 3, wherein the memory macro cells are switched in configuration as having the same minimum length of rows among lengths of the memory macro cells in the test.

6. The semiconductor device according to claim 5, wherein the minimum length corresponds to 1K rows.

7. A semiconductor device comprising:

at least one logic circuit; and a plurality of memory macro cells having a plurality of memory cell array blocks each composed of a plurality of memory cells, the memory cells being different in length of rows or columns, wherein the memory macro cells are switched in configuration as having the same length of rows or columns between the memory cell array blocks in test.

8. The semiconductor device according to claim 7, wherein the memory macro cells are switched in response to a common test address.

9. A semiconductor device comprising:

at least one logic circuit;

a plurality of memory macro cell having a plurality of memory cells having a plurality of memory cell array blocks having a plurality of memory cells, composed of rows and columns;

a switching circuit configured to convert an input column address signal indicating a first column address for use of two or more of the memory macro cells in response to a switching signal, the first column address being not shared by at least the two memory macro cells, to select one of the rows, the switching circuit having an address register for storing a start address, a subtracter for subtracting the start address from a second column address indicated by the column address signal, and a selector for selecting either the second column addresses or the output of the subtracter as the first column address in response to the switching signal; and a decoder configured to decode the converted column address signal to set address spaces having the same length of rows between the plurality of memory cells, thus selecting at least one memory cell located on a column corresponding to the decoded address signal.

10. A semiconductor device comprising:

at least one logic circuit; and a plurality of memory macro cells of different product types, having a plurality of memory cell array blocks each composed of a plurality of memory cells, different in length of rows or columns, wherein the memory macro cells are switched in configuration as having the same length of rows or columns between the memory cell array blocks in a test not related to the product types, each memory macro cell being not switched in configuration in another test related to each corresponding product type.

11. A method of testing a semiconductor device having at least one logic circuit and at least one memory macro cell having a plurality of memory cell array blocks each composed of a plurality of memory cells, the method comprising the steps of:

selecting addresses designating the memory cell array blocks in test in response to a switching signal; and switching the memory macro cell in configuration as having the same length of rows corresponding to one memory cell array block in the test in accordance with the selected addresses.

12. A method of testing a semiconductor device having at least one logic circuit and at least one memory macro cell having a plurality of memory cell array blocks each having a plurality of memory cells, composed of rows and columns, the method comprising the steps of:

selecting addresses for designating the memory cell array blocks in test among external addresses in response to a switching signal;

decoding a row or a column address signal corresponding to the selected addresses to select at least one memory cell located on a row or a column corresponding to the decoded address signal;

converting the row or the column address signal in response to a switching signal; and setting address spaces having the same length of rows or columns between the plurality of memory cells using the converted signal.

13. A method of testing a semiconductor device having at least one logic circuit and a plurality of memory macro cells having a plurality of memory cell array blocks each composed of a plurality of memory cells, comprising the step of switching at least one of the memory macro cells in configuration as having the same length of rows or columns between the memory macro cells, the configuration being different from a configuration of row and column for a regular operation.

14. The method according to claim 13, wherein the switching step includes the step of switching the memory macro cells in configuration as having the same minimum length of rows among lengths of the memory macro cells in the test.

15. The method according to claim 13, wherein the minimum length corresponds to 1K rows.

16. A method of testing a semiconductor device having at least one logic circuit and a plurality of memory macro cells having a plurality of memory cell array blocks each composed of a plurality of memory cells, the memory cells being different in length of rows or columns, the method comprising the step of switching the memory macro cells in configuration as having the same length of rows or columns between the memory cell array blocks in test.

17. The semiconductor device according to claim 16, wherein the switching step includes the step of switching the memory macro cells in response to a common test address.

18. A method of testing a semiconductor device having at least one logic circuit and a plurality of memory macro cells having a plurality of memory cell array blocks having a plurality of memory cells, composed of rows and columns, the method comprising the steps of:

converting an input column address signal indicating a first column address for use of two or more of the memory macro cells in response to a switching signal, the first column address being not shared by at least the two memory macro cells, to select one of the rows;

subtracting a start address from a second column address indicated by selecting either the second column addresses or a result of the subtraction as the first column address in response to the switching signal; and decoding the converted column address signal to set address spaces having the same length of rows between the plurality of memory cells, thus selecting at least one memory cell located on a column corresponding to the decoded address signal.

19. A method of testing a semiconductor device having at least one logic circuit and a plurality of memory macro cells of different product types, having a plurality of memory cell array blocks each composed of a plurality of memory cells, different in length of rows or columns, the method comprising the steps of;

testing the memory macro cells by switching the memory macro cells in configuration as having the same length of rows or columns between the memory cell array blocks in a test not related to the product types; and testing each memory macro cell without switching each memory macro cell in configuration in another test related to each corresponding product type.

* * * * *